US009288917B2

(12) United States Patent
Huang et al.

(10) Patent No.: US 9,288,917 B2
(45) Date of Patent: Mar. 15, 2016

(54) MANUFACTURING METHOD FOR MULTI-LAYER CIRCUIT BOARD

(71) Applicant: Unimicron Technology Corp., Taoyuan (TW)

(72) Inventors: Pei-Chang Huang, Taoyuan County (TW); Cheng-Po Yu, Taoyuan County (TW); Han-Pei Huang, Taoyuan County (TW)

(73) Assignee: Unimicron Technology Corp., Taoyuan (TW)

( * ) Notice: Subject to any disclaimer, the term of this patent is extended or adjusted under 35 U.S.C. 154(b) by 314 days.

(21) Appl. No.: 14/073,873

(22) Filed: Nov. 7, 2013

(65) Prior Publication Data

US 2015/0121694 A1     May 7, 2015

(51) Int. Cl.
*H05K 3/46*     (2006.01)
*H05K 1/02*     (2006.01)

(52) U.S. Cl.
CPC ............ *H05K 3/4679* (2013.01); *H05K 1/0268* (2013.01); *H05K 3/4652* (2013.01); *H05K 2201/09063* (2013.01); *H05K 2201/09918* (2013.01)

(58) Field of Classification Search
CPC . H05K 1/0268; H05K 3/4652; H05K 3/4679; H05K 2201/09063; H05K 2201/09918
See application file for complete search history.

(56) References Cited

U.S. PATENT DOCUMENTS

| | | | | |
|---|---|---|---|---|
| 6,376,052 B1 * | 4/2002 | Asai | ...................... | H05K 3/0094 174/255 |
| 6,586,686 B1 * | 7/2003 | Enomoto | ............. | H05K 3/4617 174/262 |
| 6,930,258 B1 * | 8/2005 | Kawasaki | ......... | H01L 23/49811 174/255 |
| 7,576,288 B2 * | 8/2009 | Kondo | ................. | H05K 3/4617 174/254 |
| 8,633,397 B2 * | 1/2014 | Jeong | .................. | H01L 23/5389 174/260 |
| 2012/0325533 A1 * | 12/2012 | Yoshimura | ........... | H05K 3/4623 174/258 |

FOREIGN PATENT DOCUMENTS

| | | | |
|---|---|---|---|
| GB | 2180697 A | * | 4/1987 |
| JP | 2002164664 A | * | 6/2002 |
| TW | 484350 | | 4/2002 |
| TW | 1341161 | | 4/2011 |
| TW | 1347809 | | 8/2011 |

OTHER PUBLICATIONS

"Office Action of Taiwan Counterpart Application", issued on May 29, 2014, p. 1-p. 9, in which the listed reference was cited.

* cited by examiner

*Primary Examiner* — Carl Arbes
(74) *Attorney, Agent, or Firm* — Jianq Chyun IP Office

(57) ABSTRACT

A manufacturing method for a multi-layer circuit board includes the following steps. Firstly, a substrate having two surfaces opposite to each other and a via connecting there between is provided. Next, a patterned circuit layer is formed on each of the surfaces by using the via as an alignment target. Each patterned circuit layer includes a concentric-circle pattern. Next, a first stacking layer is formed on each of the surfaces. Then, a first through hole penetrating regions of the first stacking layer and the substrate where a first concentric circle from the center of the concentric-circle pattern is orthogonally projected thereon is formed. Next, a second stacking layer is formed on each first stacking layer. Afterward, a second through hole penetrating regions of the first, the second stacking layers and the substrate where a second concentric circle from the center of the concentric-circle pattern is orthogonally projected thereon is formed.

14 Claims, 6 Drawing Sheets

MANUFACTURING METHOD FOR MULTI-LAYER CIRCUIT BOARD

BACKGROUND OF THE INVENTION

1. Field of the Invention

The invention relates to a manufacturing method for a circuit board, and particularly relates to a manufacturing method for a multi-layer circuit board.

2. Description of Related Art

As the integration of electronic products is increasingly improved, a circuit layer of a circuit board applied to the high-integration electronic products increases from single layer, double layer to 6 layers, 8 layers and even more than 10 layers, so as to mount more electronic components on a printed circuit board. Generally speaking, the most common manufacturing process for a circuit board is the lamination process. When the lamination process is used to manufacture the circuit board, an alignment accuracy between each circuit layer and insulating layer needs to be appropriately controlled. Therefore, in the manufacturing process of the circuit board, a plurality of alignment targets are usually formed in a previous stacking layer through a photolithography process. Then, after another layer is added, X ray is used to find the alignment targets of the previous layer, and a milling process is performed to form alignment targets for a subsequent process.

However, since the alignment targets in the previous stacking layer are formed through the photolithography process, the process itself already causes errors. When the milling process using X ray is performed, additional errors in the milling process also occur. Thus, alignment errors caused by the alignment targets of each layer continuously accumulate. If a number of circuit layers of the circuit board increases, the accumulated errors of the alignment targets also increase, resulting in an overly large deviation of an interlayer alignment accuracy that makes a design of a conductive via and a bottom layer bonding pad unable to be miniaturized.

SUMMARY OF THE INVENTION

The invention provides a manufacturing method for a multi-layer circuit board capable of improving an interlayer alignment accuracy of the multi-layer circuit board, increasing wiring density of a circuit layer, and making it possible that a conductive via and a bonding pad of a bottom layer are designed to be miniaturized. Even a pattern design with a single-sided alignment accuracy up to less than 50 µm can be achieved.

A manufacturing method for a multi-layer circuit board of the invention includes the following. First, a substrate is provided. The substrate includes surfaces opposite to each other and a first via connecting the surfaces. Then, the first patterned circuit layer is formed on each of the surfaces by using the first via as the alignment target. Each of the first patterned circuit layers includes a first concentric-circle pattern surrounding the first via. Then, a first stacking layer is formed on each of the surfaces, the first stacking layer including a first dielectric layer and a first circuit layer covering the first dielectric layer. Then, a first through hole is formed. The first through hole penetrates regions of the first stacking layers and the substrate where an inner diameter of a first concentric circle from a center of the first concentric-circle pattern is orthogonally projected on. Then, a second stacking layer is formed on each of the first stacking layers. Each of the second stacking layers includes a second dielectric layer and a second circuit layer covering the second dielectric layer. Then, a second through hole is formed. The second through hole penetrates regions of the second stacking layers, the first stacking layers, and the substrate where an inner diameter of a second concentric circle from the center of the first concentric-circle pattern is orthogonally projected on.

Based on the above-mentioned description, the manufacturing method for the multi-layer circuit board of the invention forms the concentric-circle pattern on the surface of the substrate at the innermost, then the concentric-circle pattern is used as the alignment target in each of the stacking layers to form the corresponding alignment through hole, and then the alignment through hole of each layer is used to perform the subsequent process of the corresponding stacking layer, such as using the alignment through hole as the reference for alignment to form the patterned circuit layer and conductive via of each layer. Therefore, the manufacturing method of the invention reduces accumulation of alignment error between layers, and further reduces deviations of layers in the multi-layer circuit board. Therefore, the invention improves the alignment accuracy of the multi-layer circuit board and increases the wiring density of the circuit layer. In addition, the design of the conductive via and the bonding pad of the bottom layer are allowed to be miniaturized. Even the pattern design with a single-sided alignment accuracy up to less than 50 µm can be achieved.

To make the above features and advantages of the invention more comprehensible, embodiments accompanied with drawings are described in detail as follows.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1A:
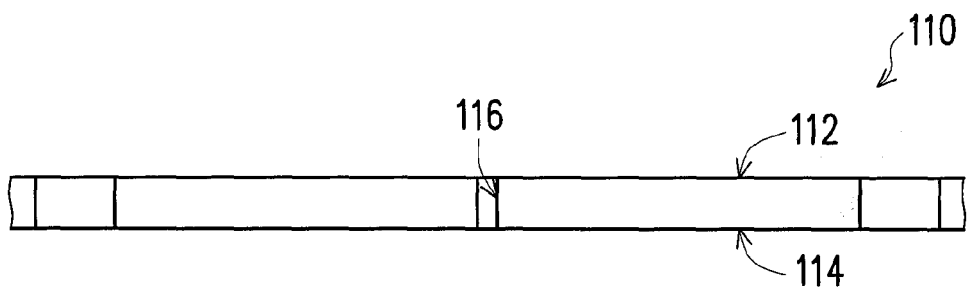
FIGS. 1A to 1G are schematic views illustrating a process flow of a manufacturing method for a multi-layer circuit board according to an embodiment of the invention.
Figure 1B:
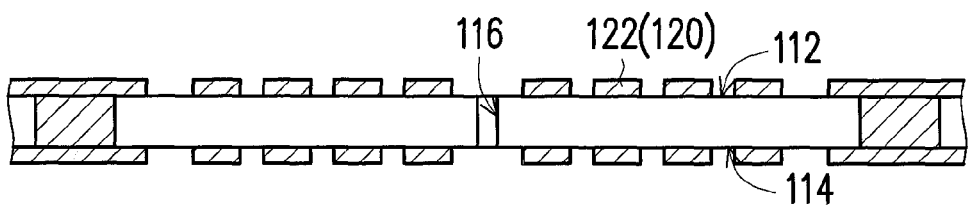

Reference will now be made in detail to the present preferred embodiments of the invention, examples of which are illustrated in the accompanying drawings. Wherever possible, the same reference numbers are used in the drawings and the description to refer to the same or like parts.

FIGS. 1A to 1G are schematic views illustrating a process flow of a manufacturing method for a multi-layer circuit board according to an embodiment of the invention. FIG. 2 is a top view illustrating a substrate and a first patterned circuit layer according to an embodiment of the invention. In this embodiment, the manufacturing method for the multi-layer circuit board includes the following steps. First, as shown in FIG. 1A, a substrate 110 is provided. The substrate 110 includes surfaces 112 and 114 opposite to each other and a first via 116 connecting the surfaces 112 and 114. Then, referring to FIGS. 1B and 2, a first patterned circuit layer 120 is formed on each of the surfaces 112 and 114 by using the first via 116 as an alignment target. In this embodiment, as shown in FIG. 2, an outer diameter D1 of the first via 116 substantially ranges between 0.5 mm and 0.8 mm. It should be noted that the views of the process flow shown in FIGS. 1A to 1G are sectional views of a process flow in an area A of FIG. 2. As shown in FIG. 2, the first patterned circuit layer 120 includes a first concentric-circle pattern 122 surrounding the first via 116. The first concentric-circle pattern 122 includes a plurality of concentric circles, and an interval G1 between any two of the concentric circles substantially ranges between 50 μm to 100 μm. However, the invention is not limited thereto. People having ordinary skills in the art may make adjustments accordingly according to the design and layout of the product.

Figure 1C:
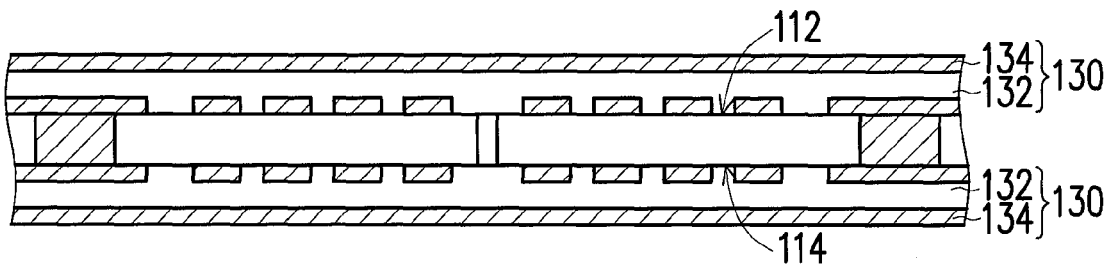
Figure 1D:
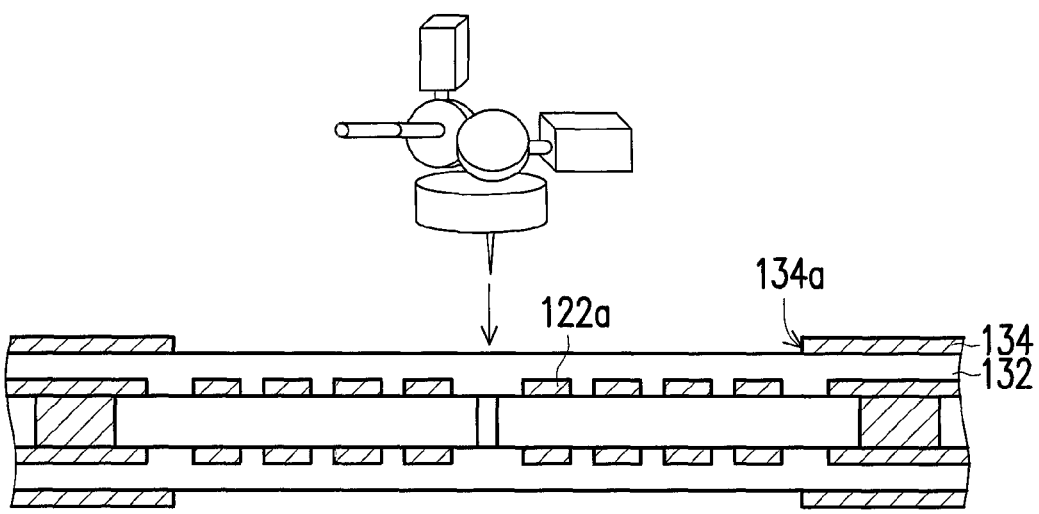
Figure 1E:
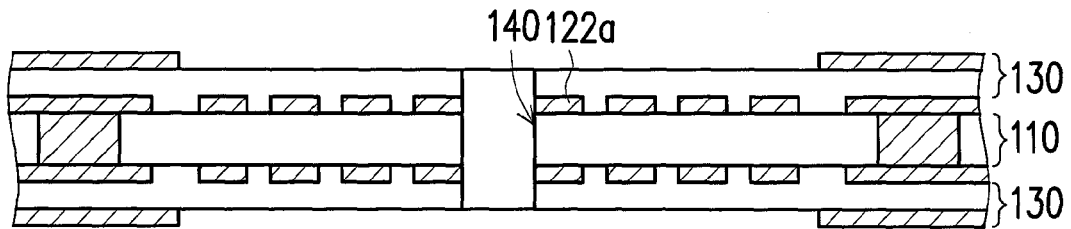
Figure 2:
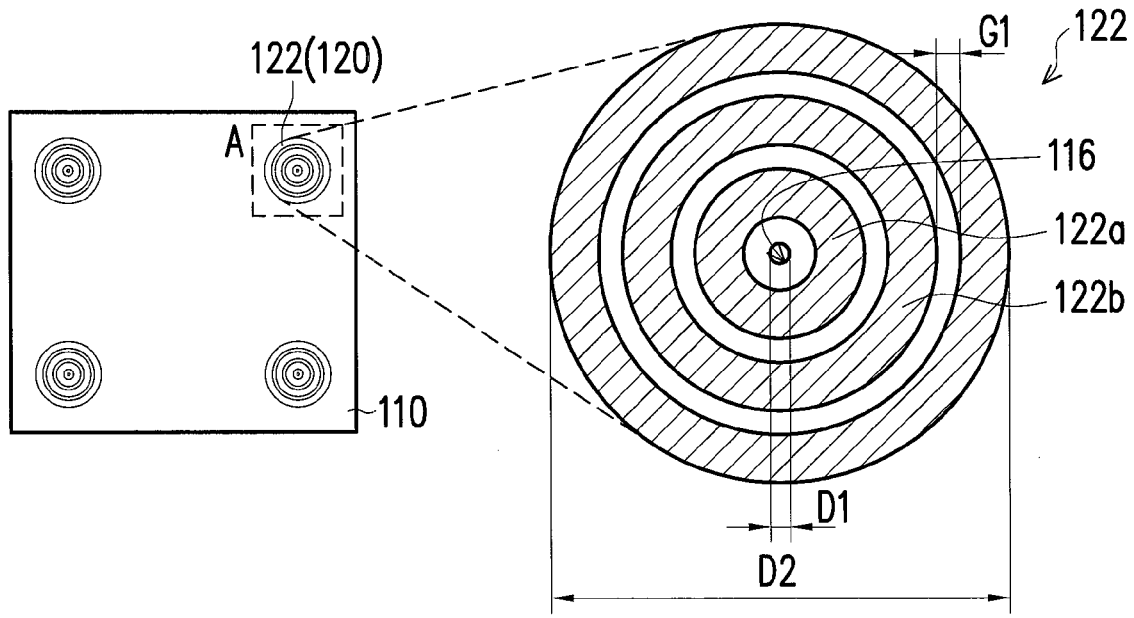
FIG. 2 is a top view illustrating a substrate and a first patterned circuit layer according to an embodiment of the invention.
Figure 3:
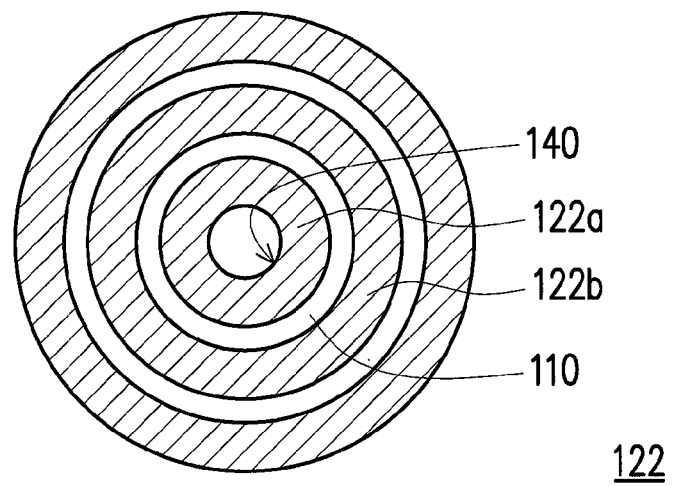
FIG. 3 is a top view illustrating a first concentric-circle pattern of FIG. 1E.

Then, as shown in FIG. 1C, a first stacking layer 130 is formed on each of the surfaces 112 and 114. The first stacking layer 130 includes a first dielectric layer 132 and a first circuit layer 134, and the first circuit layer 134 covers the first dielectric layer 132. Then, referring to FIGS. 1D and 1E together, a first through hole 140 is formed by using $CO_2$ laser drilling, for example. As shown in FIG. 1E, the first through hole 140 penetrates regions of the first stacking layer 130 and the substrate 110 where an inner diameter of a first concentric circle 122a from a center of the concentric-circle pattern 122 is orthogonally projected on. FIG. 3 is a top view that shows the first concentric-circle pattern 122 penetrated by the first through hole 140.

In this embodiment, a material of the first patterned circuit layer 120 and the first circuit layer 134 is copper. Since copper only has a higher absorption rate in a short wavelength region with a wavelength shorter than the ultraviolet region (<0.3 μm), and the wavelength of light of $CO_2$ laser is longer (approximately longer than 10 μm), belonging to the infrared region, the $CO_2$ laser is less likely to be absorbed by copper and causes a hole due to ablation. Therefore, the copper-made concentric-circle pattern 122 may be considered as a copper mask for $CO_2$ laser, configured to confine a cutting range of $CO_2$ laser to the first stacking layer 130 and the substrate 110. Namely, by using $CO_2$ laser to drill outwardly from the center, the first through hole 140 is formed by drilling and has the inner diameter of the first concentric circle 122a as a boundary thereof. It should be noted that when $CO_2$ laser is used to form the first through hole 140, the first circuit layer 134 in FIG. 1C needs to be patterned to form a first opening 134a shown in FIG. 1D, such that the first opening 134a exposes a region of the first dielectric layer 132 where the first concentric-circle pattern 122 is orthogonally projected on before proceeding to the subsequent drilling process.

Naturally, the invention is not limited thereto. In other embodiments of the invention, direct laser drilling (DLD) may be used to form the first through hole 140. If DLD is used to form the first through hole 140, it is not necessary to form the opening 134a shown in FIG. 1D. Instead, laser drilling may be directly performed to form the first through hole 140 after the first circuit layer 134 is formed. In this embodiment, the first through hole 140 may be formed by drilling from outer surfaces of the first stacking layers 130 at both sides of the substrate 110 toward the substrate 110 simultaneously, for example.

Then, the first through hole 140 may serve as an alignment target to perform a subsequent process to the first stacking layer 130. For example, the first through hole 140 may serve as an alignment target in a photolithography process to pattern the first circuit layer 134, so as to form a second patterned circuit layer of the multi-layer circuit board. Or, the first through hole 140 may serve as an alignment target to form a first conductive via on the first stacking layer 130.

Figure 1F:
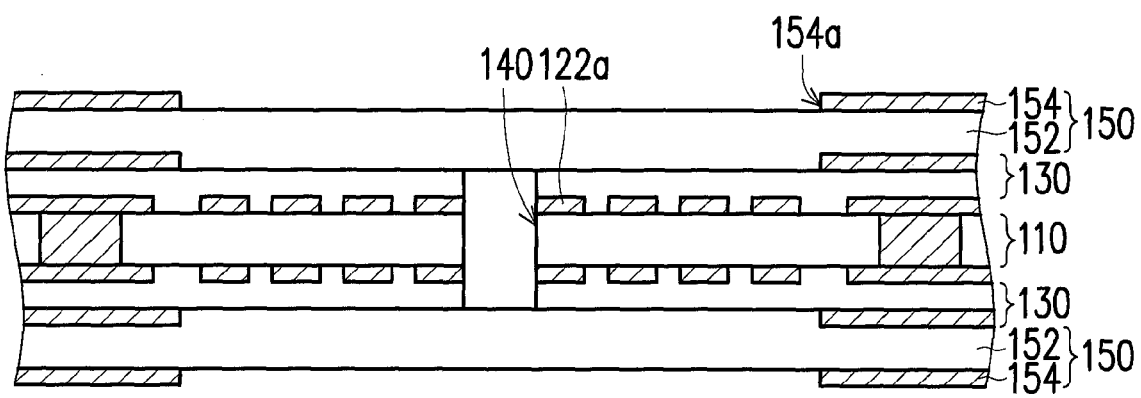
Figure 1G:
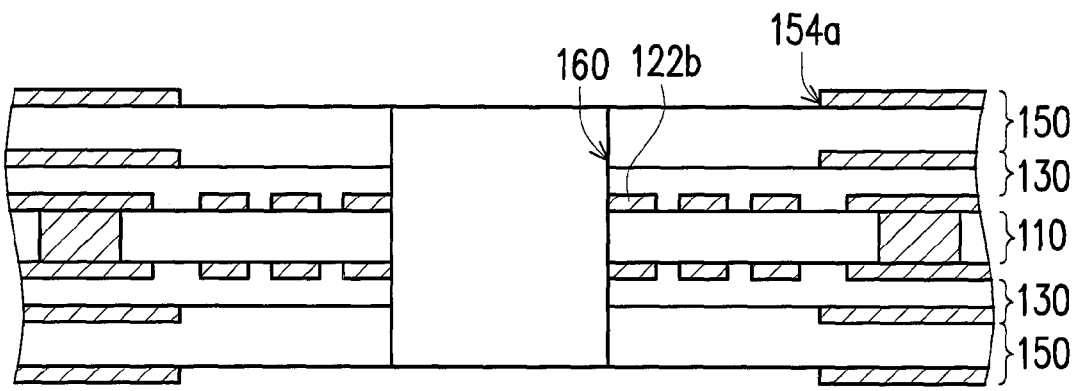
Figure 4:
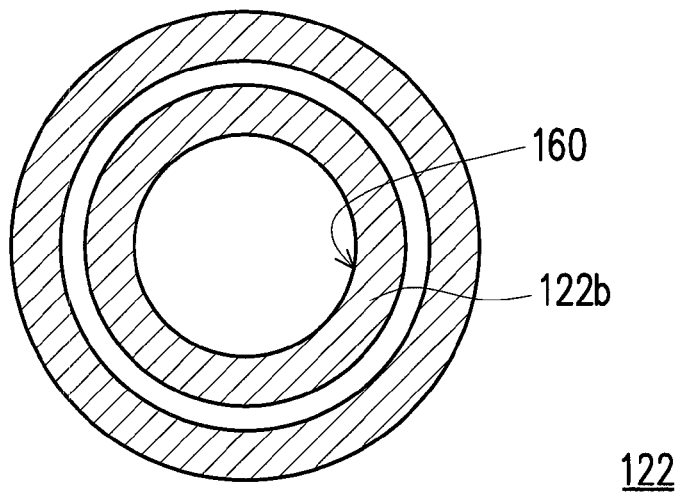
FIG. 4 is a top view illustrating a first concentric-circle pattern of FIG. 1G.

Then, as shown in FIG. 1F, a second stacking layer 150 is formed on a corresponding of the first stacking layers 130. Each of the second stacking layers 150 includes a second dielectric layer 152 and a second circuit layer 154, and the second circuit layer 154 covers the second dielectric layer 152. Afterwards, as shown in FIG. 1G, a second through hole 160 is formed. In addition, the second through hole 160 penetrates regions of the second stacking layer 150, the first stacking layer 130, and the substrate 110 in which an inner diameter of a second concentric circle 122b from the center of the first concentric-circle pattern 122 is orthogonally projected on. FIG. 4 is a top view that shows the first concentric-circle pattern 122 penetrated by the second through hole 160.

Similar to formation of the first through hole, the second through hole 160 may also be formed by $CO_2$ laser drilling. Namely, by using $CO_2$ laser to drill outwardly from the center and remove a portion of the substrate 110 between the first concentric circle 122a and the second concentric circle 122b, as shown in FIG. 3, the first concentric circle 122 may be stripped from the concentric-circle pattern 122 to form the second through hole 160 shown in FIG. 4. It should be noted that when $CO_2$ laser is used to form the second through hole 160, a second opening 154a shown in FIG. 1F needs to be formed, such that the second opening 154a exposes a region of the second dielectric layer 152 where the first concentric-circle pattern 122 is orthogonally projected on before proceeding to the subsequent drilling process.

Naturally, in other embodiments of the invention, DLD may also be used to form the second through hole 160. In this way, it is not necessary to form the second opening 154a shown in FIG. 1F. Instead, DLD may be directly performed to form the second through hole 160. In this embodiment, the second through hole 160 may be formed by drilling from outer surfaces of the second stacking layers 150 at both sides of the substrate 110 toward the substrate 110 simultaneously.

Then, the second through hole 160 may serve as an alignment target to perform a subsequent process to the second stacking layer 150. For example, the second through hole 160 may serve as an alignment target in a photolithography process to pattern the second circuit layer 154, so as to form a third patterned circuit layer of the multi-layer circuit board. Or, the second through hole 160 may serve as an alignment target to form a second conductive via on the second stacking layer 150. The second conductive via is connected with the first conductive via on the first stacking layer 130.

Even though this embodiment only describes a process flow of forming a two-layered stacking structure on two sides of the substrate, the invention naturally imposes no limitation on numbers of stacking layers, circuit layers, and concentric circles of the concentric-circle pattern. People having ordinary skills in the art may follow the manufacturing method described above to continue stacking an additional stacking layer on the second stacking layer, use the concentric-circle pattern 122 as an alignment target to form an alignment through hole of each layer, and perform a subsequent alignment process with the alignment through hole of each layer, so as to form a patterned circuit layer and/or a conductive via of each layer. Therefore, if a desired total number of patterned circuit layers of the multi-layer circuit board is N, a number of concentric circles of the first concentric-circle pattern 122 is $(N-2)/2$.

In this way, each stacking layer of the multi-layer circuit board uses the concentric-circle pattern 122 on the surface of the substrate 110 at the innermost to form the corresponding alignment hole, accumulation of alignment error between layers in the conventional art may be reduced, and deviations of layers in the multi-layer circuit board may also be prevented. In addition, conductive vias connecting layers may be formed according to this method. Since the conductive via of each layer is formed by using the concentric circle pattern 122 formed in the same photolithography process as the alignment target, a circumstance in which the alignment error, thus making the conductive via of each layer unable to be aligned, is prevented, and a wiring density of the circuit layer is improved. In addition, the conductive via and bonding pads of bottom layers may be designed to be miniaturized, and a pattern design with a single-sided alignment accuracy up to less than 50 μm can be achieved.

In addition, if the number of circuit layers required in the multi-layer circuit board is higher, a number of times of adding a layer correspondingly increases. Consequently, the number of concentric circles of the first concentric-circle pattern 122 increases as well. Namely, a maximal outer diameter D2 of the first concentric-circle pattern 122 is positively proportional to the number of times of adding a layer for the multi-layer circuit board. However, since an image-capturing window of a charge-coupled device (CCD) in a production equipment has a limitation on the maximal readable size, the maximal outer diameter D2 of the first concentric-circle pattern 122 is substantially less than or equal to 3.175 mm. Therefore, if the number of times of adding a layer for the multi-layer circuit board exceeds a predetermined amount (e.g. equal to or more than five), such that the maximal outer diameter D2 of the first concentric-circle pattern 122 is close to 3.175 mm, it then requires another concentric-circle pattern as the alignment target in the alignment process for stacking layers formed thereafter.

Figure 5:
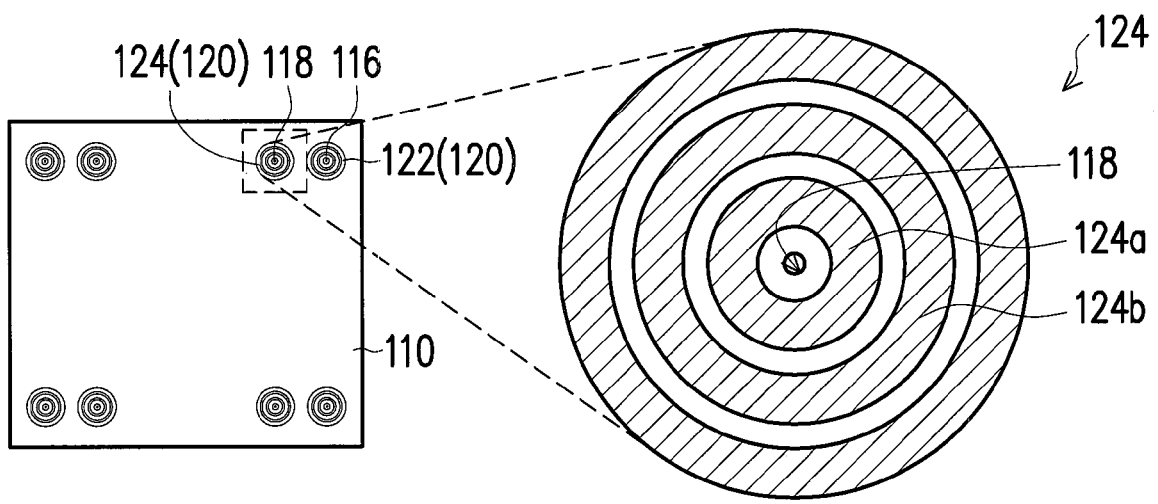
FIG. 5 is a top view illustrating a substrate and a first patterned circuit layer according to another embodiment of the invention.

FIG. 5 is a top view illustrating a substrate and a first patterned circuit layer according to another embodiment of the invention. FIGS. 6A to 6D are schematic views illustrating a partial process flow of a manufacturing method for a multi-layer circuit board according to another embodiment of the invention. Referring to FIG. 5, as described above, when the number of times of adding a layer for the multi-layer circuit board exceeds a predetermined amount, two concentric-circle patterns need to be designed. Namely, in this embodiment, the number of times of adding a layer for the multi-layer circuit board exceeds the predetermined amount (e.g. more than M times, M being a positive integer greater than 2), and the substrate 110, a part from having the first via 116, further includes a second via 118 connecting the surfaces 112 and 114 shown in FIG. 1A. Then, the first patterned circuit layer 120 is formed on each of the surfaces 112 and 114 by using the first via 116 and the second via 118 as the alignment target. Each of the first patterned circuit layers 120 further includes a second concentric-circle pattern 124 surrounding the second via 118 in addition to the first concentric-circle 122 surrounding the first via 116. Since the first concentric-circle 122 and the second concentric-circle 124 are formed in the same patterning process, accumulation of alignment error due to multiple patterning processes is prevented. Thus, starting from a $M_{th}$ stacking layer, the second concentric-circle pattern 124 is used as the alignment target for the alignment process afterwards, and a process flow thereof is substantially the same as the process flow shown in FIGS. 1A to 1G.

Figure 6A:
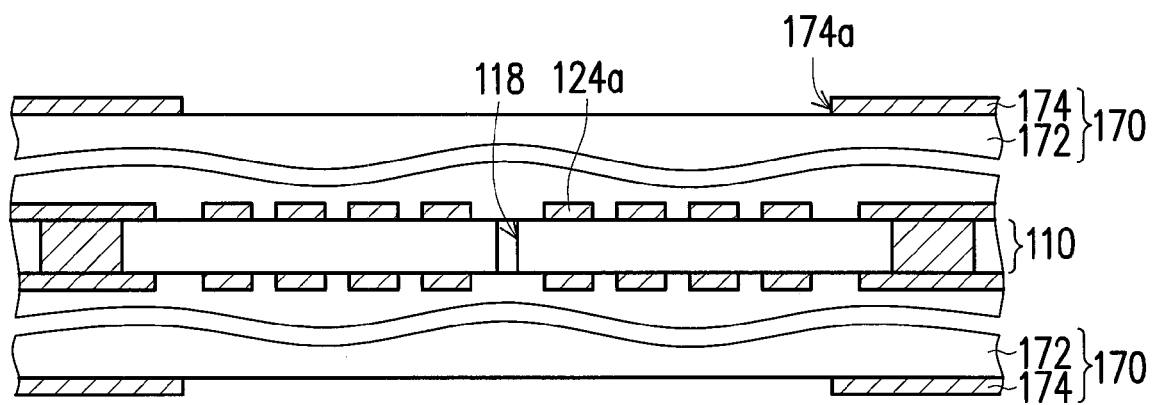
FIGS. 6A to 6D are schematic views illustrating a partial process flow of a manufacturing method for a multi-layer circuit board according to another embodiment of the invention.
Figure 6B:
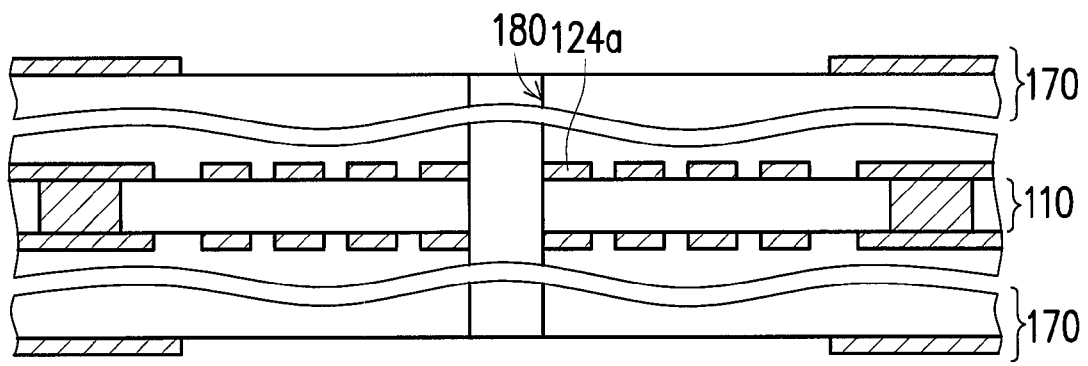

In detail, referring to both FIGS. 5 and 6A, a $M_{th}$ stacking layer may be formed on each of the second stacking layers 150 after the second concentric-circle pattern 124 is formed. In this embodiment, M is 6, for example. Namely, the first to fifth stacking layers are already formed in the multi-layer circuit board by using the first concentric-circle pattern 122, and a sixth stacking layer 170 (i.e. the $M_{th}$ stacking layer) correspondingly includes a sixth dielectric layer 172 and a sixth circuit layer 174 covering the sixth dielectric layer 172. Then, as shown in FIGS. 5 and 6B, a sixth through hole 180, which penetrates regions of the first to sixth stacking layers and the substrate 110 where an inner diameter of a first concentric circle 124a from a center of the second concentric-circle pattern 124 is orthogonally projected on.

Then, the sixth through hole 180 may serve as an alignment target to perform a subsequent process to the sixth stacking layer 150. For example, the sixth through hole 180 may serve as an alignment target in a photolithography process to pattern the sixth circuit layer 174, so as to form a patterned circuit layer of the multi-layer circuit board. Or, the sixth through hole 180 may serve as an alignment target to form a sixth conductive via on the sixth stacking layer 170.

Figure 6C:
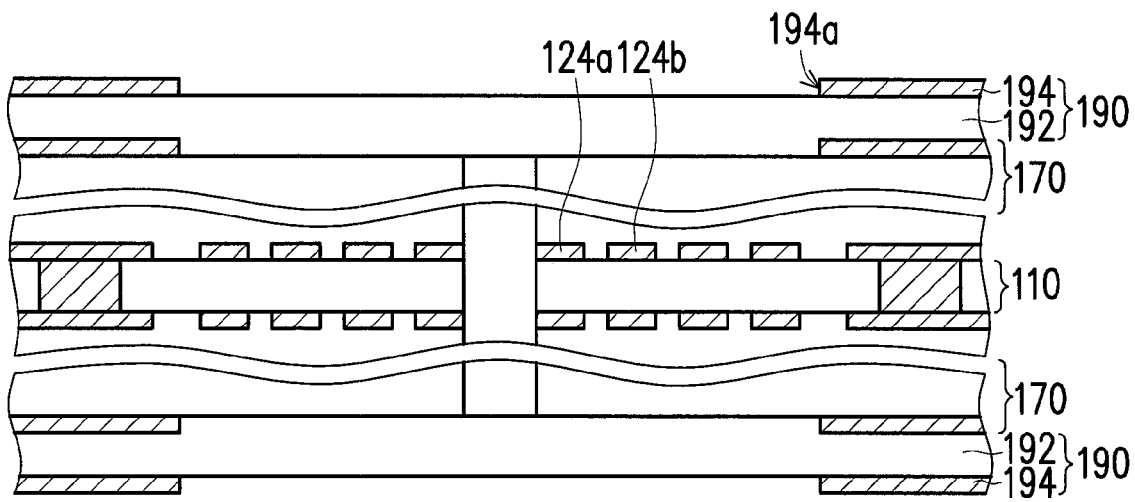
Figure 6D:
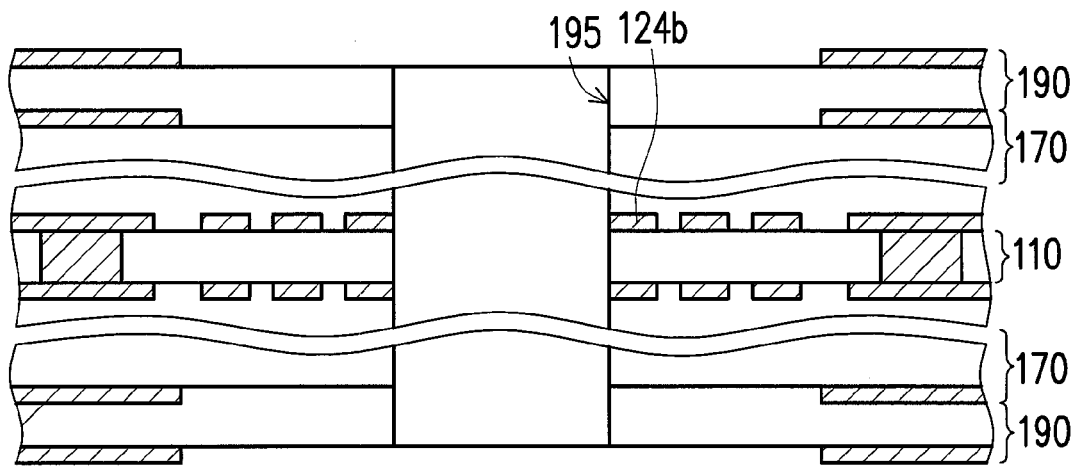

Referring to FIG. 6C, a seventh (i.e. $M+1_{th}$) stacking layer 190 is formed on each of the sixth stacking layers 170, and each of the seventh stacking layers 190 includes a seventh dielectric layer 192 and a seventh circuit layer 194 covering the seventh dielectric layer 192. Then, as shown in FIGS. 5 and 6D, a seventh through hole 195, which penetrates regions of the first to seventh stacking layers and the substrate 110 where an inner diameter of a second concentric circle 124b from the center of the second concentric-circle pattern 124 is orthogonally projected on.

Then, the seventh through hole 195 may serve as an alignment target to perform a subsequent process to the seventh stacking layer 190. For example, the seventh through hole 195 may serve as an alignment target in a photolithography process to pattern the seventh circuit layer 194, so as to form a patterned circuit layer of the multi-layer circuit board. Or, the seventh through hole 195 may serve as an alignment target to form a seventh conductive via on the seventh stacking layer 190. The seventh conductive via is connected with the sixth conductive via on the sixth stacking layer 170, and the conductive via of each layer is connected to each other.

As previously described, the sixth through hole 180 and the seventh through hole 195 may also be formed by $CO_2$ laser or DLD. Similarly, when $CO_2$ laser is used to form the sixth through hole 180 and the seventh through hole 195, openings 174a and 194a shown in FIGS. 6A and 6C need to be formed, so as to expose regions of the sixth dielectric layer and the seventh dielectric layer 192 in which the second concentric-circle pattern 124 is orthogonally projected on the sixth dielectric layer and the seventh dielectric layer 192 before proceeding to the subsequent drilling process. If DLD is used, it is not necessary to form the openings 174a and 194a. Instead, laser drilling may be directly performed.

In view of above, the manufacturing method for the multi-layer circuit board of the invention forms the concentric-circle pattern on the surface of the substrate at the innermost, then the concentric-circle pattern is used as the alignment target in each of the stacking layers to form the corresponding alignment through hole, and then the alignment through hole of each layer is used to perform the subsequent process of the corresponding stacking layer, such as using the alignment through hole as the reference for alignment to form the patterned circuit layer and conductive via of each layer. Therefore, the manufacturing method of the invention reduces accumulation of alignment error between layers, and further reduces deviations of layers in the multi-layer circuit board. Furthermore, since the conductive via of each layer is formed by using the concentric-circle patterns formed in the same photolithography process as the alignment target, the circumstance of causing the conductive via deviating due to accumulation of alignment error between layers is reduced. Therefore, the invention improves the alignment accuracy of the multi-layer circuit board and increases the wiring density of the circuit layer. In addition, the design of the conductive via and bonding pads are allowed to be miniaturized. Even the pattern design with a single-sided alignment accuracy up to less than 50 μm can be achieved.

It will be apparent to those skilled in the art that various modifications and variations can be made to the structure of the invention without departing from the scope or spirit of the invention. In view of the foregoing, it is intended that the invention cover modifications and variations of this invention provided they fall within the scope of the following claims and their equivalents.

What is claimed is:

1. A method for manufacturing a multi-layer circuit board, comprising:
    providing a substrate, the substrate comprising two surfaces opposite to each other and a first via connecting the surfaces;
    forming a first patterned circuit layer on each of the surfaces by using the first via as an alignment target, wherein each of the first patterned circuit layers comprises a first concentric-circle pattern surrounding the first via;
    forming a first stacking layer on each of the surfaces, the first stacking layer comprising a first dielectric layer and a first circuit layer covering the first dielectric layer;
    forming a first through hole, the first through hole penetrating regions of the first stacking layers and the substrate where an inner diameter of a first concentric circle from a center of the first concentric-circle pattern is orthogonally projected on;
    forming a second stacking layer on each of the first stacking layers, each of the second stacking layers comprising a second dielectric layer and a second circuit layer covering the second dielectric layer; and
    forming a second through hole penetrating regions of the second stacking layers, the first stacking layers, and the substrate where an inner diameter of a second concentric circle from the center of the first concentric-circle pattern is orthogonally projected.

2. The manufacturing method for the multi-layer circuit board as claimed in claim 1, further comprising:
    after forming the first through hole, using the first through hole as an alignment target to pattern the first circuit layers; and
    after forming the second through hole, using the second through hole as an alignment target to pattern the second circuit layers.

3. The manufacturing method for the multi-layer circuit board as claimed in claim 2, wherein a total number of patterned circuit layers of the multi-layer circuit board is N, and a number of concentric circles of the first concentric-circle pattern is (N−2)/2.

4. The manufacturing method for the multi-layer circuit board as claimed in claim 1, further comprising:
    after forming the first through hole, using the first through hole as an alignment target to form a first conductive via on each of the first stacking layers; and
    after forming the second through hole, using the second through hole as an alignment target to form a second conductive via on each of the second stacking layers,
    wherein the second conductive vias are respectively connected to the corresponding first conductive vias.

5. The manufacturing method for the multi-layer circuit board as claimed in claim 1, wherein the method of forming the first through hole and the second through hole comprises $CO_2$ laser drilling.

6. The manufacturing method for the multi-layer circuit board as claimed in claim 5, further comprising:
    before forming the first through hole, forming a first opening on the first circuit layer, wherein the first opening exposes a region of the first dielectric layer where the first concentric-circle pattern is orthogonally projected on; and
    before forming the second through hole, forming a second opening on the second circuit layer, wherein the second opening exposes a region of the second dielectric layer where the first concentric-circle pattern is orthogonally projected on.

7. The manufacturing method for the multi-layer circuit board as claimed in claim 5, wherein the step of forming the first through hole comprises drilling from outer surfaces of the first stacking layers toward the substrate simultaneously, and the step of forming the second through hole comprises drilling from outer surfaces of the second stacking layers toward the substrate simultaneously.

8. The manufacturing method for the multi-layer circuit board as claimed in claim 1, wherein the method of forming the first through hole and the second through hole comprises direct laser drilling (DLD).

9. The manufacturing method for the multi-layer circuit board as claimed in claim 8, wherein the step of forming the first through hole comprises drilling from outer surfaces of the first stacking layers toward the substrate simultaneously, and the step of forming the second through hole comprises drilling from outer surfaces of the second stacking layers toward the substrate simultaneously.

10. The manufacturing method for the multi-layer circuit board as claimed in claim 1, wherein the substrate further comprises a second via connecting the surfaces, and each of the first patterned circuit layers further comprises a second concentric-circle pattern surrounding the second via, the manufacturing method for the multi-layer circuit board further comprising:
    forming a $M_{th}$ stacking layer on each of the second stacking layers, the $M_{th}$ stacking layer comprising a $M_{th}$ dielectric layer and a $M_{th}$ circuit layer covering the $M_{th}$ dielectric layer, wherein M is a positive integer greater than two;
    forming a $M_{th}$ through hole penetrating regions of the first to $M_{th}$ stacking layers and the substrate where an inner diameter of a first concentric circle from a center of the second concentric-circle pattern is orthogonally projected on;
    forming a $(M+1)_{th}$ stacking layer on each of the $M_{th}$ stacking layers, each of the $(M+1)_{th}$ stacking layers comprises a $(M+1)_{th}$ dielectric layer and a $(M+1)_{th}$ circuit layer covering the $(M+1)_{th}$ dielectric layer; and
    forming a $(M+1)_{th}$ through hole penetrating regions of the first to $(M+1)_{th}$ stacking layers and the substrate where an inner diameter of a second concentric circle from the center of the second concentric-circle pattern is orthogonally projected on.

11. The manufacturing method for the multi-layer circuit board as claimed in claim 10, further comprising:
    after forming the $M_{th}$ through hole, using the $M_{th}$ through hole as an alignment target to pattern the $M_{th}$ circuit layers to form the $M+1_{th}$ patterned circuit layers; and after forming the $(M+1)_{th}$ through hole, using the $(M+1)_{th}$ through hole as an alignment target to pattern the $(M+1)_{th}$ circuit layers to form two $(M+2)_{th}$ patterned circuit layers.

12. The manufacturing method for the multi-layer circuit board as claimed in claim 10, further comprising:

after forming the $M_{th}$ through hole, using the $M_{th}$ through hole as an alignment target to form a $M_{th}$ conductive via on each of the $M_{th}$ stacking layers; and after forming the $(M+1)_{th}$ through hole, using the $(M+1)_{th}$ through hole as an alignment target to form a $(M+1)_{th}$ conductive via on each of the $(M+1)_{th}$ stacking layers, wherein the $(M+1)_{th}$ conductive vias are respectively connected to the corresponding $M_{th}$ conductive vias.

13. The manufacturing method for the multi-layer circuit board as claimed in claim 10, wherein M is substantially equal to or greater than five.

14. The manufacturing method for the multi-layer circuit board as claimed in claim 10, wherein the method of forming the $M_{th}$ through hole and the $(M+1)_{th}$ through hole comprises direct laser drilling (DLD).

* * * * *